United States Patent
Lin (10) Patent No.: US 7,020,040 B2
(45) Date of Patent: Mar. 28, 2006

(54) UTILIZING AN ACPI TO MAINTAIN DATA STORED IN A DRAM

(75) Inventor: I-Ming Lin, Taipei Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 295 days.

(21) Appl. No.: 10/604,268

(22) Filed: Jul. 8, 2003

(65) Prior Publication Data

US 2004/0107310 A1    Jun. 3, 2004

(30) Foreign Application Priority Data

Oct. 3, 2002    (TW) .............................. 91122920 A (51) Int. Cl.
*G11C 7/00*    (2006.01)
*G06F 13/14*    (2006.01)

(52) U.S. Cl. ...................... 365/229; 365/228; 365/227; 365/226; 365/222; 711/104; 711/105; 711/106; 713/300; 713/320; 713/330

(58) Field of Classification Search ................ 365/218, 365/203, 222, 226, 227, 228, 229; 714/1; 713/300, 320, 330; 711/104, 105, 106
See application file for complete search history.

(56) References Cited

U.S. PATENT DOCUMENTS 6,128,747 A * 10/2000 Thoulon ...................... 713/330
6,542,996 B1 * 4/2003 Chang et al. ............... 713/300
6,633,987 B1 * 10/2003 Jain et al. .................... 713/300

* cited by examiner

*Primary Examiner*—B. James Peikari
(74) *Attorney, Agent, or Firm*—Winston Hsu (57) ABSTRACT

A method and related apparatus for utilizing an ACPI to maintain data stored in a DRAM includes a processor, a DRAM, a south bridge chipset, and a rechargeable battery device. The south bridge chipset includes a system controller, a buffer, a memory controller, an integrated device electronics controller, and a data conversion circuit. The data conversion circuit converts a hard-disk access command transmitted from the system controller into a memory access command of the memory controller. The memory controller accesses the buffer and the DRAM by executing the memory access command. When the computer system enters a power-saving mode, a switch is turned on allowing the battery device to constantly self-refresh the DRAM for maintaining the data stored in the DRAM. When the computer system powers up, the switch is turned off and the battery device is recharged.

23 Claims, 6 Drawing Sheets

UTILIZING AN ACPI TO MAINTAIN DATA STORED IN A DRAM

BACKGROUND OF INVENTION

1. Field of the Invention

The present invention relates to a method and related apparatus for maintaining stored data of a dynamic random access memory (DRAM), and more particularly, to a method and related apparatus for self-refreshing a DRAM with a battery device when a computer system enters a power-saving mode.

2. Description of the Prior Art

Today's high-speed microprocessor systems deal with large amounts of data in the daily lives of ordinary people. The most popular microprocessor system is a desktop computer system. By making use of the computer system, people can quickly exchange and handle abundant data to promote efficiency and fun for working and living.

In recent years, the operating speed of the computer system has increased along with the development of the central processing unit (CPU). As the operating speed of the CPU surpasses the frequency of a giga-hertz (GHz), the amount of data that the CPU can handle also increases significantly. However, since the computer system comprises a plurality of components and the data processing speed of each component is not the same, a component with a slow data processing speed will retard the execution efficiency of the whole computer system.

Figure 1:
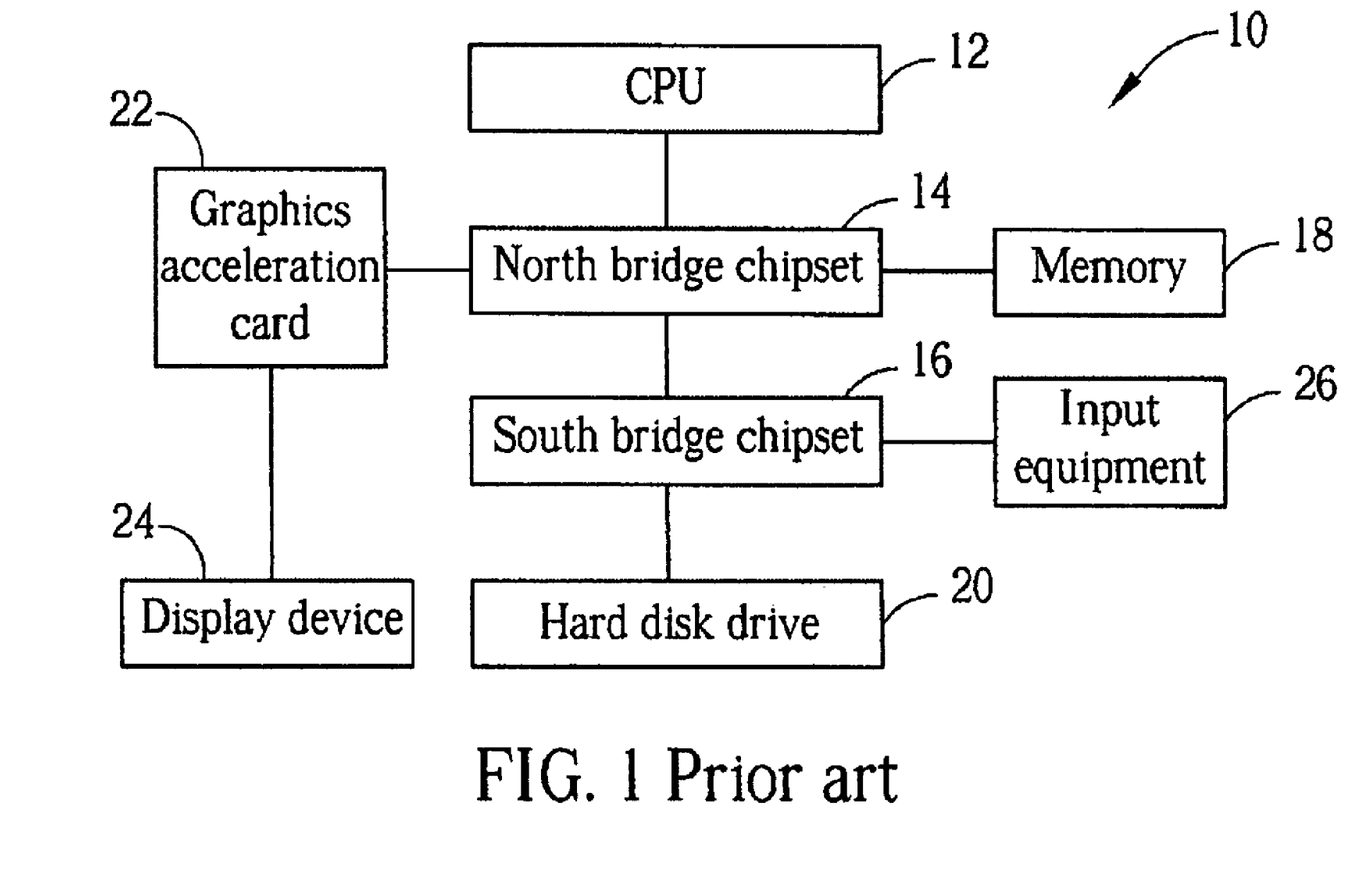
FIG. 1 is a block diagram of a prior art computer system.

Please refer to FIG. 1. FIG. 1 is a functional block diagram of a first computer system 10 of the prior art. The computer system 10 comprises a CPU 12, a north bridge (NB) chipset 14, a south bridge (SB) chipset 16, a memory 18, a hard disk drive 20, a graphics acceleration card 22, a display device 24, and input equipment 26.

The CPU 12 is for executing the operations of the computer system 10 to implement the integrated functions of the computer system 10. The north bridge chipset 14 is electrically connected to the CPU 12 for handling the data exchange between the CPU 12, the memory 18 as a DRAM, and the graphics acceleration card 22. The display device 16 as a monitor is electrically connected to the graphics acceleration card 14 for providing a visual image output of the computer system 10.

The south bridge chipset 16 is electrically connected to the north bridge chipset 14 for exchanging data with the CPU 12 through the north bridge chipset 14. For example, the south bridge chipset 16 can implement the data exchange between the CPU 12, the input equipment 26, and the hard disk drive 20.

The input equipment 26 includes a keyboard, a mouse, and so on. The memory 18 is a volatile storage media and the hard disk drive 20 is a non-volatile storage media. The data stored in the memory 18 will be lost due to a suspension of power and the data stored in the hard disk drive 20 is free from the influence of power suspension when the computer system 10 is shut down. Therefore, the user stores the data in the hard disk drive 20 to avoid losing the data.

The operations of data processing with the computer system 10 are as follows. The CPU 12 will generate a command to access data on the hard disk drive 20, and the data from the hard disk drive 20 will then be transmitted through the south bridge chipset 16 to the north bridge chipset 14. Afterwards, the north bridge chipset 14 transmits the data from the hard disk drive 20 to the memory 18 for storage. Thus, the CPU 12 can access the data from the hard disk drive 20 in the memory 18 through the north bridge chipset 14 and temporarily store the data in flash memory of the CPU 12 (not shown) for carrying on the additional operations. When the computer system 10 is preparing to be shut down, the data stored in the memory 18 will be transmitted back to the hard disk drive 20 to avoid losing the data.

The access speed of the memory 18 is generally faster than that of the hard disk drive 20. For example, the DRAM memory 18 can operate with an access speed of nano-second (ns) while the hard disk drive 20 operates with the access speed of milli-second (ms). Therefore, the hard disk drive 20 operates slower than the memory 18, and the execution efficiency of the computer system 10 is influenced by the slower speed of the hard disk drive 20. In addition, the hard disk drive 20 can deliver less data per second than the memory 18 can deliver. Therefore, it is beneficial to make use of the memory 18 for shortening the data transmission time and promoting the efficiency of the whole system.

Figure 2:
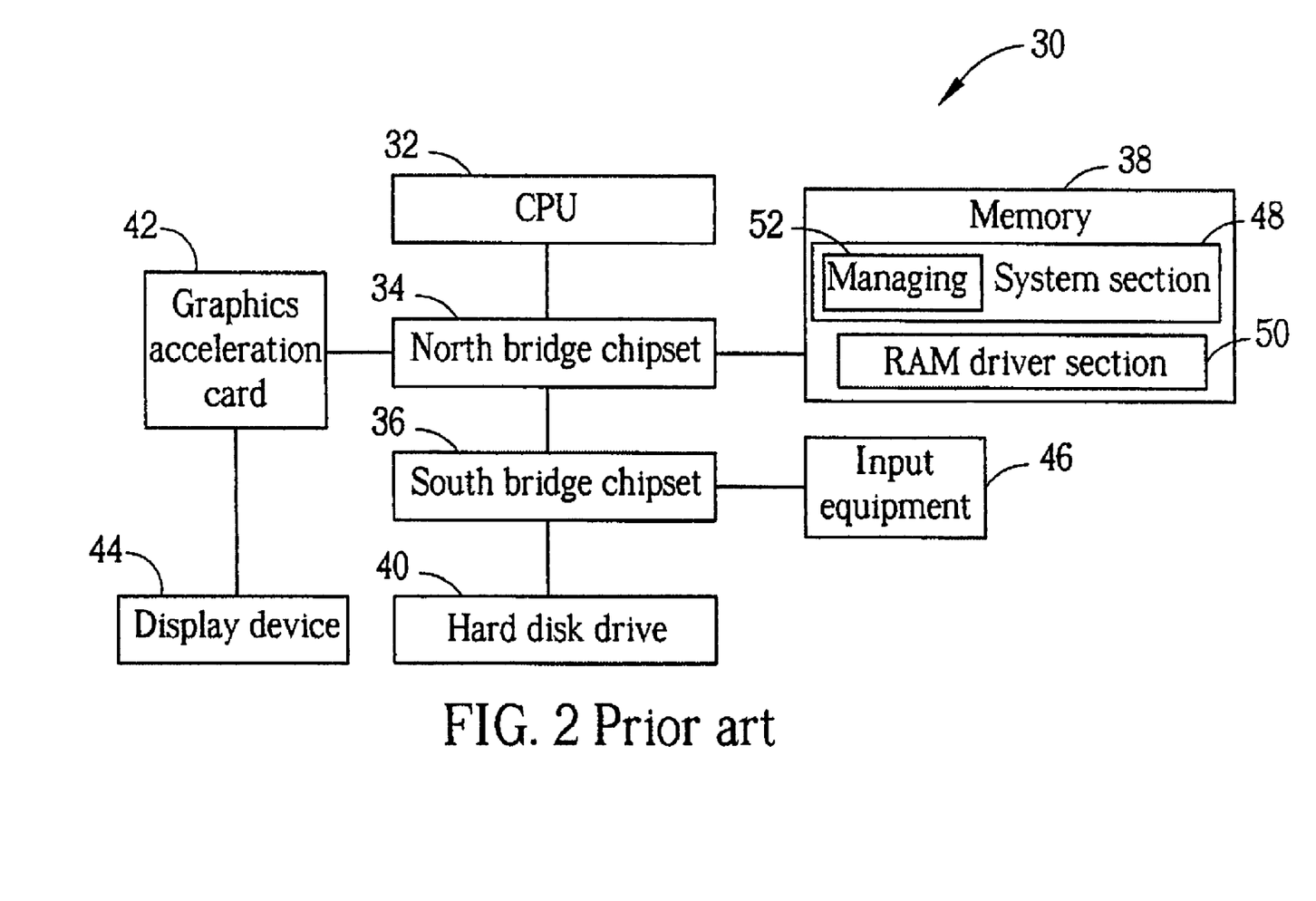
FIG. 2 is a block diagram of another prior art computer system.

Please refer to FIG. 2. FIG. 2 is a functional block diagram of a second computer system 30 of the prior art. The computer system 30 comprises a CPU 32, a north bridge chipset 34, a south bridge chipset 36, a memory 38, a hard disk drive 40, a graphics acceleration card 42, a display device 44, and input equipment 46. The functions of the components of the computer system 30 are the same with those of the first computer system 10.

The memory 38 comprises a system section 48 and a RAM driver section 50. The system section 48 is used by an operating system (OS) for operations, and the RAM driver section 50 is used temporarily for replacing the hard disk drive 40. The memory site range and the capacity of the RAM driver section 50 in the memory 38 are passed to the operating system during the power-on procedure, and then the operating system will assign a managing program 52 in the system section 48.

The managing program 52 manages data accessing of the RAM driver section 50. When the CPU 32 accesses the hard disk drive 40, the managing program 52 will first intercept an interrupt vector corresponding to the hard disk drive 40 and then transform the format of the signal for accessing the hard disk drive 40 into the format of the signal for accessing the memory 38. At the same time, the managing program 52 will transform the data format in the hard disk drive 40 into the data format of the memory 38, and then the data that is to be stored in the hard disk drive 40 is temporarily stored in the RAM driver section 50 of the memory 38.

Because the access speed of the memory 38 is faster than that of the hard disk drive 40, the CPU 32 can directly access the data from the RAM driver section 50 through the managing program 52 in the memory 38 to carry out operations and quickly store the results in the RAM driver section 50 instead of on the hard disk drive 40.

The computer system 30 controls the transformation between the hard disk drive 40 and the memory 38 by making use of the managing program 52 without the need of modifying the related electric circuit. However, the computer system 30 should still comprise the hard disk drive 40 because the memory 38 is a volatile storage media and the data stored in the memory 38 will be lost due to the suspension of power after the computer system 30 is shut down. Therefore, before the computer system 30 is shut down, the data temporarily stored in the RAM driver section 50 should be transmitted back to the hard disk drive 40 and the hard disk drive 40 installed in the computer system 30 can keep the data.

Figure 3:
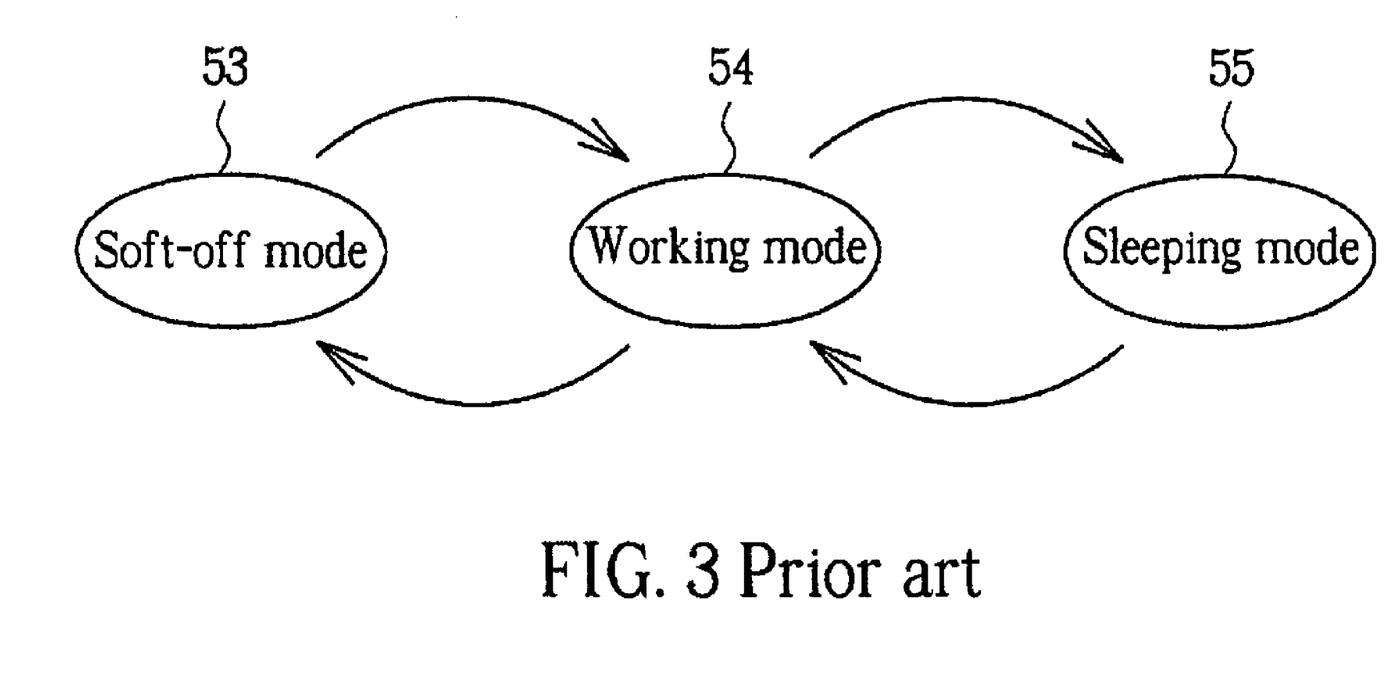
FIG. 3 is a schematic diagram of a prior art computer system.

Please refer to FIG. 3. FIG. 3 is a schematic diagram showing the operations of a computer system of the prior art.

According to the format set by the advanced configuration and power interface (ACPI) of the prior art, the operating statuses of the above-mentioned computer systems 10 and 30 can be classified into a soft-off mode 53, a working mode 54, and a sleeping mode 55. When the computer systems 10 and 30 are in the working mode 54, their inner hardware components, such as the CPUs 12 and 32, can get the operating voltages needed to run software programs as well as the operating system. When the computer systems 10 and 30 are idle without performing any application, the computer systems 10 and 30 still provide the operating voltages to their inner hardware components. The above-mentioned situation will generate unnecessary power consumption of the computer systems 10 and 30. According to the ACPI, when the computer systems 10 and 30 are idle, the computer systems 10 and 30 can enter the sleeping mode 55 to avoid the power dissipation.

Generally speaking, the sleeping mode 55 can be subdivided into S1, S2, S3, S4, and S5 modes. Regarding the S4 mode, when the computer systems 10 and 30 execute a suspend-to-disk (STD) operation, the computer systems 10 and 30 have to finish the running programs and the resident programs and temporarily store the current system mode on the hard disk drive to enter the S4 mode.

In addition, when the computer systems 10 and 30 execute a shutdown procedure, the computer systems 10 and 30 also have to execute the STD operation to store the data that is temporarily stored in the memory back on the hard disk drive to avoid losing the data. Afterwards, the computer systems 10 and 30 enter the soft-off mode 53, namely the S5 mode. After the computer systems 10 and 30 are powered-on and leave the soft-off mode 53, similarly to leaving the above-mentioned S4 mode, due to the fact that the system mode is stored on the hard disk drive, the computer systems 10 and 30 can quickly return to the circumstances before the S5 mode, and enter the working mode 54 through accessing the system mode previously stored in the hard disk drive.

Regarding the DRAM, when the computer systems 10 and 30 enter the soft-off mode 53, the computer systems 10 and 30 will not provide the DRAM with the operating voltages for self-refreshing, so the data stored in the DRAM will be lost. Therefore, returning the data temporarily stored in the memory to the hard disk drive before the shutdown procedure can avoid data loss. Since the system modes of the computer systems 10 and 30 will be stored on the hard disk drive, the power-on speeds of the computer systems 10 and 30 are relatively slower.

In the S4 mode, the DRAM can be used to replace the bard disk drive to store the system modes of the computer systems 10 and 30 and the access speed of the DRAM is very quick. However, after the computer systems 10 and 30 are shut down, the data stored in the DRAM will be lost, so the DRAM still cannot replace the non-volatile hard disk drive for quickly powering-on the computer systems 10 and 30.

In addition, the computer system of the prior art can also make use of a non-volatile memory, such as flash memory, as the storage media in the computer system to replace the bard disk drive. Due to the fact that the flash memory and the hard disk drive are both non-volatile storage media, the flash memory can keep the stored data without the need for returning the data to the hard disk drive when the computer system is shut down. However, because the flash memory makes use of the changes of the threshold voltages to record the binary system values, the flash memory takes a much longer time for writing the data than the DRAM does. That is, the access speed of the flash memory is slower than that of the DRAM. Furthermore, the manufacturing cost of the flash memory is higher than that of the DRAM with the same capacity. Therefore, taking the price into consideration, the flash memory is not suitable for the computer system with the need of the large-scale data access applications.

SUMMARY OF INVENTION

It is therefore a primary objective of the claimed invention to provide a computer system with a dynamic random access memory to replace a hard disk drive to solve the above-mentioned problem.

The claimed invention provides a computer system that includes a processor for controlling operations of the computer system, a dynamic random access memory (DRAM) electrically connected to the processor for storing data, and a south bridge chipset electrically connected to the processor and the DRAM. The south bridge chipset includes a system controller for controlling operations of the south bridge chipset, a buffer for temporarily storing the data, a memory controller for accessing the data in the DRAM, an integrated device electronics controller (IDE controller) for accessing data in an integrated device electronics (IDE) component, and a data conversion circuit electrically connected to the memory controller and the IDE controller. The data conversion circuit is used for converting a hard-disk access command transmitted from the system controller to the IDE controller into a memory access command of the memory controller. The memory controller accesses the buffer and the DRAM by executing a memory access command. The claimed invention also includes a power supply for generating a plurality of operating voltages to drive the computer system and a battery device for generating the operating voltages that self-refresh the DRAM.

When the computer system performs a power supply management operation consistent with an advanced configuration and power interface (ACPI) and enters a power-saving mode, the computer system can make use of the battery device to constantly self-refresh the DRAM for maintaining the data stored in the DRAM.

The claimed invention also provides a method for storing data in a computer system. The method uses a computer system that incluses a processor for controlling operations of the computer system, dynamic random access memory (DRAM) electrically connected to the processor for storing the data, a south bridge chipset electrically connected to the processor and the DRAM for converting a hard-disk access command into a memory access command and for executing the memory access command corresponding to the hard-disk access command to access the DRAM, a power supply for generating a plurality of operating voltages to drive the computer system, and a battery device for providing the operating voltage that self-refreshes the DRAM.

The method includes providing the battery device to constantly self-refresh the DRAM for maintaining the data stored in the DRAM when the computer system performs a power supply management operation consistent with an advanced configuration and power interface (ACPI) and enters a power-saving mode.

These and other objectives of the claimed invention will become obvious to those of ordinary skill in the art after reading the following detailed description of the preferred embodiment, which is illustrated in the various figures and drawings.

DETAILED DESCRIPTION

Figure 4:
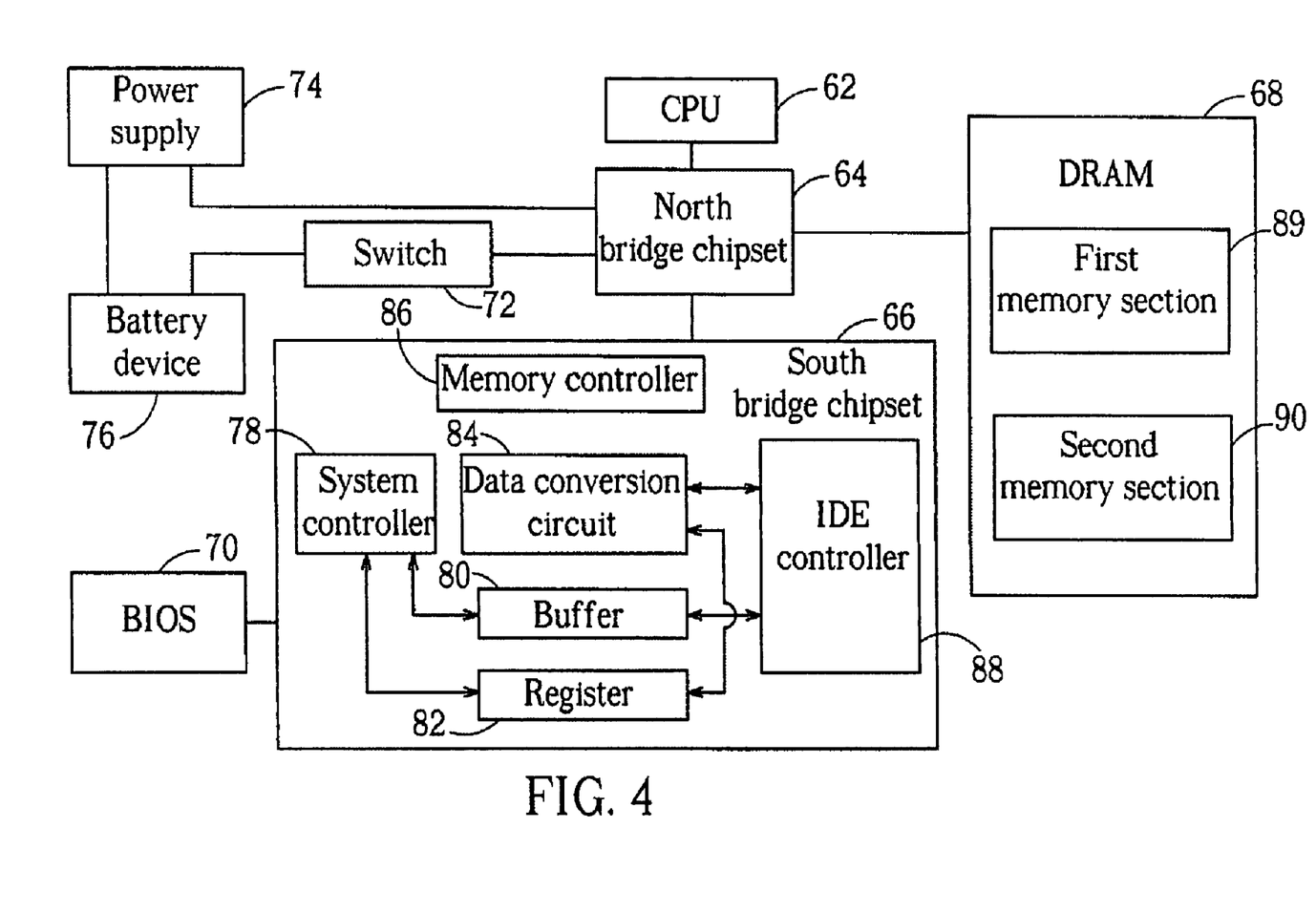
FIG. 4 is a block diagram of a computer system of the present invention.

Please refer to FIG. 4. FIG. 4 is a block diagram of a computer system 60 according to the present invention. The computer system 60 comprises a CPU 62, a north bridge chipset 64, a south bridge chipset 66, a DRAM 68, a basic input/output system (BIOS) 70, a switch 72, a power supply 74, and a battery device 76. The CPU 62 controls the operations of the computer system 60. The north bridge chipset 64 controls the data access between the CPU 62 and the DRAM 68, and the south bridge chipset 66 controls the data access between the BIOS 70 and the CPU 62 and the data access between other perimeter devices, such as a keyboard or mouse, and the CPU 62. The BIOS 70 executes a power-on-self-test (POST) of the computer system 60, and loads an operating system (OS) after completing the POST. The DRAM 68, such as the double data rate memory (DDR memory), is used to store the data. The power supply 74 is electrically connected to a pre-determined voltage, such as 110 volts, to convert the pre-determined voltage into various operating voltages for various operations of the computer system 60. The battery device 76 is a rechargeable battery for providing the DRAM 68 with the operating voltage for self-refreshing. The switch 72 decides if the operating voltage for self-refreshing the DRAM 68 is provided by the battery device 76 or by the power supply 74.

In addition, the south bridge chipset 66 comprises a system controller 78, a buffer 80, a register 82, a data conversion circuit 84, a memory controller 86, and an integrated device electronics controller (IDE controller) 88. The system controller 78 controls the operations of the south bridge chipset 66. The IDE controller 88 controls data accessing of an integrated device electronics (IDE) component.

The data conversion circuit 84 will convert a hard-disk access command transmitted from the system controller 78 to the IDE controller 88 into a memory access command of the memory controller 86, and the memory controller 86 accesses the buffer 80 and the DRAM 68 by executing the memory access command. For example, when the CPU 62 would like to store data in a hard disk drive, the system controller 78 will generate a hard-disk access command, such as an interrupt vector, and store the data in the buffer 80. Afterwards, the data conversion circuit 84 will convert the hard-disk access command corresponding to the data into a memory access command.

For example, the hard-disk access command comprises parameters as the cylinder, the sector, and the head for writing the data in the buffer 80 onto the hard disk drive. The data conversion circuit 84 converts the hard-disk writing function into a memory writing function according to the hard-disk access command, and transforms the data sites and the data into the corresponding memory data stream. After that, the memory controller 86 stores the memory data stream in a pre-determined memory address of the DRAM 68 through the north bridge chipset 64.

Similarly, when the CPU 62 would like to access data from the hard disk drive, the system controller 78 will generate a hard-disk access command to access the hard disk drive. The data conversion circuit 84 converts the hard-disk access command into a memory access command, and transforms the corresponding parameters as the cylinder, the sector, and the head into a memory address of the DRAM 68. Afterwards, the memory controller 86 accesses the information related to the memory address from the DRAM 68 through the north bridge chipset 64, and stores the information in the buffer. Finally, the information will be delivered to the CPU 62 for additional operations.

Because one embodiment of the present invention makes use of the DRAM 68 to replace the hard disk drive of the prior art for storing the data, the DRAM 68 comprises a first memory section 89 and a second memory section 90. The first memory section 89 is used as the memory for the computer system 60 executing the operating system, and the second memory section 90 is used as the hard disk drive to store the non-volatile data. The operating principles of the computer system 60 of the present invention are as follows.

Figure 5A:
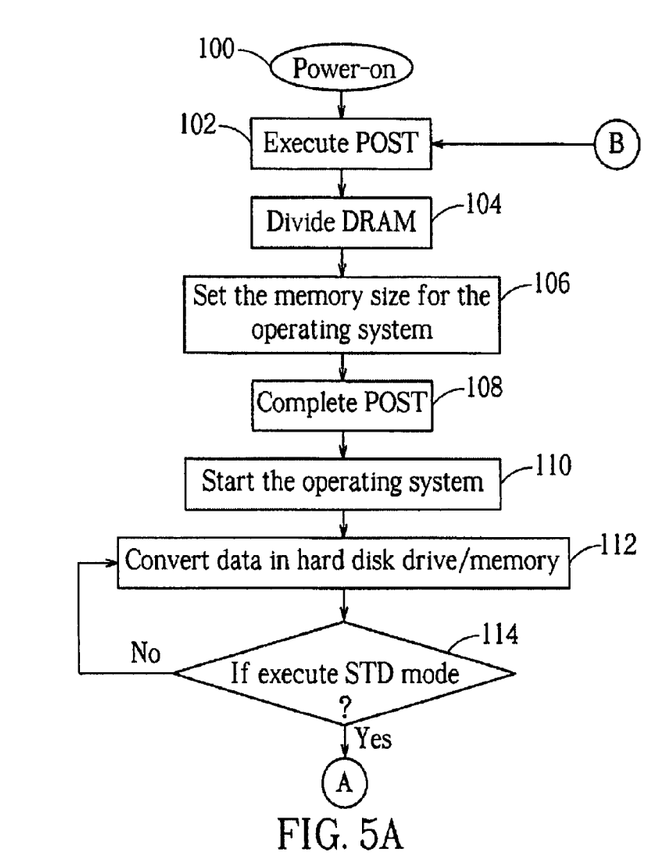
FIG. 5 is a flowchart of operations of the computer system shown in FIG. 4.
Figure 5B:
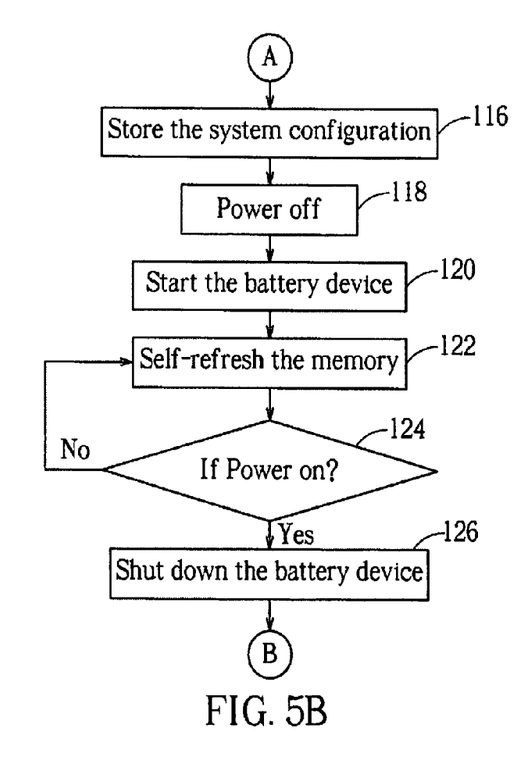

Please refer to FIGS. 5A and 5B. FIGS. 5B and 5B show a flowchart of operations of the computer system of the present invention. The operations of the computer system 60 comprise the following steps:

Step 100: The computer system 60 is powered on;
Step 102: The BIOS 70 executes a POST;
Step 104: The BIOS 70 divides the DRAM 68 into a first memory section 89 and a second memory section 90;
Step 106: The BIOS 70 sets the first memory section 89 as the memory capacity for the operating system;
Step 108: The BIOS 70 completes the POST;
Step 110: Start the operating system;
Step 112: The south bridge chipset 66 executes the data conversion between the hard disk drive and the memory to access the second memory section 90;
Step 114: Has the computer system 60 executed a suspend-to-disk (STD) mode? If the answer is yes, proceed to step 116, otherwise return to step 112;
Step 116: Finish all the running and resident programs, and store the current configuration of the computer system 60 in the second memory section 90;
Step 118: The computer system 60 is powered off;
Step 120: Start the battery device 76 to make the second memory section 90 perform self-refreshing function.
Step 122: The second memory 90 self-refreshes using power provided by the battery device 76;
Step 124: Is the computer system 60 powered-on? If the answer is yes, proceed to step 126, otherwise proceed to step 122;
Step 126: Shut down the battery device 76, and the power supply 74 starts to charge the battery device 76. Proceed to step 102.

First of all, the computer system is powered-on and starts the BIOS 70 to execute a POST. In one embodiment of the present invention, the user can decide if the computer system 60 makes use of the DRAM 68 to replace the hard disk drive of the prior art through a hardware device as a jumper or a switch. If the computer system 60 does not use the DRAM 68 to replace the hard disk drive the prior art, that is, the computer system 60 comprises both the DRAM 68 and the hard disk drive, the POST and other procedures of the computer system 60 are the same with the computer system 10 of the prior art as shown in FIG. 1. Therefore, this embodiment of the invention only describes the situation when the computer system 60 uses the DRAM 68 to replace the hard disk drive of the prior art.

Because the computer system 60 makes use of the DRAM 68 to replace the hard disk drive of the prior art, the BIOS 70 must set a memory section as the hard disk drive in the DRAM 68. That is, the BIOS 70 sets the first memory section 89 as the memory capacity for the operating system, and the second memory section 90 is set as the hard disk drive of the prior art.

Nowadays, the computer system 60 generally uses a memory module made by packaging a memory chip on a circuit board as the available memory capacity of the computer system 60. For example, the dual in-line memory module (DIMM) in a desktop computer and the small outline dual in-line memory module (SODIMM) in the notebook computer are both installed in the corresponding memory slots in the computer system. In the present embodiment, if the computer system 60 comprises only one dual in-line memory module, the BIOS 70 will divide the dual in-line memory module into a first memory section 89 and a second memory section 90. If the computer system 60 comprises two dual in-line memory modules, then the BIOS 70 will set a dual in-line memory module as the first memory section 89 and set the other dual in-line memory module as the second memory section 90. In another embodiment of the present invention, the BIOS 72 also can arbitrarily set the size of the first memory section 89 and the second memory section 90 according to the total available size of the dual in-line memory modules. The BIOS 70 will then make available to the operating system the information about the size and allocation of the DRAM 68 (the site and the capacity of the first memory section 89 and the second memory section 90). For the operating system, the available memory capacity is the first memory section 89.

Finally, the BIOS 70 completes the POST and loads the operating system. At this time, the south bridge chipset 66 will intercept the hard-disk access command generated by the operating system, and convert the hard-disk access command into a corresponding memory access command in the south bridge chipset 66 for accessing the second memory section 90. Because the second memory section 90 is treated as the hard disk drive of the prior art, accessing the second memory section 90 is functionally equal to accessing the hard disk drive. From the point of view of the operating system or the CPU 62, the procedure can be treated as using a hard-disk access command to access a hard disk drive. However, in actuality, the present embodiment converts the hard-disk access command into the memory access command to access the second memory section 90.

Although the computer system 60 is not connected to any hard disk drive, the computer system 60 can perform the data access operations corresponding to the hard-disk access command through the conversion in the south bridge chipset 66. In addition, according to an advanced configuration and power interface (ACPI), the devices connected to an integrated device electronics (IDE) component have to send a signal to the computer system 60 according to the current mode, such as the idle mode, standby mode, or sleeping mode. Because the present embodiment is not connected to any hard disk drive, a register 82 can be used to store the current mode of the second memory section 90. Therefore, the register 82 can directly respond to the computer system 60, or the BIOS 70 can access the register 82 to respond to the computer system 60.

According to the format set by the ACPI, when the computer system 60 enters an STD mode, the computer system 60 has to finish the running programs and resident programs, and to store the data temporarily stored in memory onto the hard disk drive. At the same time, the computer system 60 has to store the system configuration on the hard disk drive, and then the computer system 60 will be shut down (powered off). That is, when the computer system 60 is in a sleeping mode S4, the computer system 60 must store the current computer system configuration on the hard disk drive in order to quickly power on the computer system 60. Besides, when the computer system is in a soft-off mode S5, the power supply of the computer system 60 will be suspended, and the computer system 60 must store the data temporarily stored in the memory onto the hard disk drive to avoid losing data.

The present embodiment treats the second memory section 90 as the hard disk drive of the prior art, and the second memory section 90 is a volatile storage device. That is, when the power supply is suspended, the data stored in the second memory section 90 will be lost. Therefore, the battery device 76 has to provide the second memory section 90 with the operating voltage for self-refreshing. When the computer system 60 is shut down (the operating voltage provided by the power supply 74 is suspended), the switch 72 will be turned on and connect the battery device 76 to the north bridge chipset 64 to make the north bridge chipset 64 use the voltage provided by the battery device 76 to self-refresh the second memory section 90 constantly, avoiding loss of the data stored in the second memory section 90.

After the computer system 60 is powered on again, the switch 72 will be turned off and the connection between the battery device 76 and the north bridge chipset 64 will be an open circuit. In addition, the power supply 74 will charge the battery device 76. Due to the fact that the second memory section 90 stores the system configuration describing the condition before the computer system 60 is shut down, the computer system 60 can be quickly powered-on by accessing the system configuration stored in the second memory section 90. In addition, for dealing with large amount of data in the second memory section 90 for the operating system, the computer system 60 of the present embodiment also comprises a compression/decompression circuit for compressing the data stored into the second memory section 90 and decompressing the data accessed from the second memory section 90.

In contrast to the prior art, the computer system of the present invention divides the DRAM into a first memory section and a second memory section when the computer system is powered-on. The first memory section is used as the memory capacity for the operating system of the computer system, and the second memory section replaces the hard disk drive to store non-volatile data. The computer system comprises a data conversion circuit that converts a hard-disk access command into a corresponding memory access command for accessing the second memory section. In addition, the computer system further comprises a battery device. When the computer system executes a STD and suspends the power supply, the battery device can provide the second memory section of the DRAM with the operating voltage for self-refreshing and maintaining the data. The computer system of the present invention makes use of the DRAM to replace the hard disk drive of the prior art and uses a battery device to provide the operating voltage for self-refreshing the DRAM. Therefore, the computer system of the present invention not only owns the advantage of fast access speed in the volatile memory, but also owns the advantage of maintaining the data in the volatile memory after the power supply is suspended.

Moreover, the computer system of the present invention makes use of the hardware to carry on the conversion of the signal and data in all kinds of platforms without the need of considering the porting operations in various platforms in the prior art. Because the access speed of the DRAM is high, the present invention can reduce the delay caused by the hard disk drive. Besides, when compared with the hard disk drive, the DRAM has the advantage of small volume, light weight, low power-consumption, anti-vibration, low noise, and good heat dissipation, so the computer system of the present invention can be applied in compact information appliances (IA) and information PCs for providing a high-speed, quiet, and power-saving apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A computer system, the computer system comprising:
   a processor for controlling operations of the computer system;
   a dynamic random access memory (DRAM) electrically connected to the processor for storing data;
   a south bridge chipset electrically connected to the processor and the DRAM, the south bridge chipset comprising:
      a system controller for controlling operations of the south bridge chipset;
      a buffer for temporarily storing the data;
      a memory controller for accessing the data in the DRAM;
      an integrated device electronics controller (IDE controller) for accessing data in an integrated device electronics (IDE) component; and
      a data conversion circuit electrically connected to the memory controller and the IDE controller for converting a hard-disk access command transmitted from the system controller to the IDE controller into a memory access command of the memory controller wherein the memory controller accesses the buffer and the DRAM by executing the memory access command;
   a power supply for generating a plurality of operating voltages to drive the computer system; and
   a battery device for generating the operating voltages that self-refresh the DRAM;
      wherein when the computer system performs a power supply management operation consistent with an advanced mode and an advanced configuration and power interface (ACPI) and enters a power-saving mode, the computer system can make use of the battery device to constantly self-refresh the DRAM for maintaining the data stored in the DRAM.

2. The computer system of claim 1 further comprising a switch electrically connected to the battery device wherein when the computer system enters the power-saving mode, the power supply ceases providing the operating voltage for self-refreshing the DRAM, and the switch will be enabled to make the battery device provide the operating voltage for self-refreshing the DRAM, wherein the power-saving mode comprises an S4 status and an S5 status.

3. The computer system of claim 1, wherein the battery device is a rechargeable battery.

4. The computer system of claim 1, wherein when the computer system is powered-on, the power supply will provide the operating voltage for refreshing the DRAM and the switch will be disabled, and then the power supply will charge the battery device.

5. The computer system of claim 1, wherein the memory controller accesses an input data temporarily stored in the buffer of the south bridge chipset according to the memory access command, and the input data will be stored in the DRAM.

6. The computer system of claim 1, wherein the memory controller accesses an output data in the DRAM according to the memory access command, and the output data will be stored in the buffer of the south bridge chipset.

7. The computer system of claim 1 further comprising a basic input/output system (BIOS) for executing a power on self test (POST) of the computer system, wherein the BIOS executes the POST and divides the DRAM into a first memory section and a second memory section, and the second memory section is set as a memory capacity that can be used for the operating system of the computer system and the first memory section can be accessed by the memory access command corresponding to the hard-disk access command.

8. The computer system of claim 7, wherein the DRAM comprises at least two memory modules installed in two memory slots of the computer system respectively, and one of the memory modules corresponds to a first memory section and the other memory module corresponds to a second memory section.

9. The computer system of claim 8, wherein the DRAM comprises a memory module installed in a memory slot of the computer system.

10. A method for storing data in a computer system, the computer system comprising a processor for controlling operations of the computer system, a dynamic random access memory (DRAM) electrically connected to the processor for storing the data, a south bridge chipset electrically connected to the processor and the DRAM for converting a hard-disk access command into a memory access command and for executing the memory access command corresponding to the hard-disk access command to access the DRAM, a power supply for generating a plurality of operating voltages to drive the computer system, and a battery device for providing the operating voltage that self-refreshes the DRAM, the method comprising:
   providing the battery device to constantly self-refresh the DRAM for maintaining the data stored in the DRAM when the computer system performs a power supply management operation consistent with an advanced mode and an advanced configuration and power interface (ACPI) and enters a power-saving mode.

11. The method of claim 10, wherein the battery device is a rechargeable battery.

12. The method of claim 11, wherein when the computer system is powered-on, the power supply will provide the operating voltage for refreshing the DRAM and a switch will be disabled, and then the power supply will charge the battery device.

13. The method of claim 10, wherein the power-saving mode comprises an S4 status.

14. The method of claim 10, wherein the power-saving mode comprises an S5 status.

15. The method of claim 10, wherein the memory controller accesses an output data in the DRAM according to the memory access command, and the output data will be stored in the buffer of the south bridge chipset.

16. The method of claim 10, wherein the computer system further comprises a basic input/output system (BIOS) for executing a power on self test (POST) of the computer system, the method further comprising:
   executing the POST and dividing the DRAM into a first memory section and a second memory section; and setting the second memory section as a memory capacity that can be used for the operating system of the computer system;
wherein the first memory section can be accessed by the memory access command corresponding to the hard-disk access command.

17. The method of claim 16, wherein the DRAM comprises at least two memory modules respectively installed in two memory slots of the computer system, and one of the memory modules corresponds to the first memory section and the other memory module corresponds to the second memory section.

18. The method of claim 16, wherein the DRAM comprises a memory module installed in a memory slot of the computer system.

19. A method for storing data in a computer system, the computer system comprising a processor for controlling operations of the computer system, a dynamic random access memory (DRAM) electrically connected to the processor for storing the data, a south bridge chipset electrically connected to the processor and the DRAM for converting a hard-disk access command into a memory access command and for executing the memory access command corresponding to the hard-disk access command to access the DRAM, the method comprising:

a data maintaining method for providing a battery device to constantly self-refresh the DRAM for maintaining the data stored in the DRAM when the computer system performs a power supply management operation consistent with an advanced mode and an advanced configuration and power interface (ACPI) and enters a power-saving mode.

20. The method of claim 19, wherein the computer system further comprises the battery device electrically connected to the south bridge chipset for providing the operating voltage that self-refreshes the DRAM.

21. The method of claim 19, wherein the computer system further comprises a switch electrically connected to the battery device wherein when the computer system enters the power-saving mode, the power supply ceases providing the operating voltage for self-refreshing the DRAM, and the switch will be enabled to make the battery device provide the operating voltage for self-refreshing the DRAM.

22. The method of claim 21, wherein the power-saving mode comprises an S4 status.

23. The method of claim 21, wherein the power-saving mode comprises an S5 status.

* * * * *